United States Patent
Roohparvar (10) Patent No.: US 7,366,013 B2
(45) Date of Patent: Apr. 29, 2008

(54) SINGLE LEVEL CELL PROGRAMMING IN A MULTIPLE LEVEL CELL NON-VOLATILE MEMORY DEVICE

(75) Inventor: Frankie F. Roohparvar, Monte Sereno, CA (US)

(73) Assignee: Micron Technology, Inc., Boise, ID (US)

( * ) Notice: Subject to any disclaimer, the term of this patent is extended or adjusted under 35 U.S.C. 154(b) by 97 days.

(21) Appl. No.: 11/298,013

(22) Filed: Dec. 9, 2005

(65) Prior Publication Data

US 2007/0133249 A1 Jun. 14, 2007

(51) Int. Cl.
*G11C 16/04* (2006.01)

(52) U.S. Cl. .............. 365/185.03; 365/185.11
(58) Field of Classification Search ........... 365/168, 365/185.03, 185.11, 185.12, 185.17, 185.23
See application file for complete search history.

(56) References Cited

U.S. PATENT DOCUMENTS

| | | | |
|---|---|---|---|
| 4,586,163 A * | 4/1986 | Koike | .............. 365/104 |
| 5,043,940 A * | 8/1991 | Harari | .............. 365/185.03 |
| 5,862,074 A | 1/1999 | Park | |
| 5,973,958 A | 10/1999 | Parker | |
| 6,172,913 B1 | 1/2001 | Ricco | |
| 6,535,419 B2 * | 3/2003 | Parker et al. | ........ 365/185.03 |
| 6,657,891 B1 * | 12/2003 | Shibata et al. | ........ 365/185.03 |
| 7,177,184 B2 * | 2/2007 | Chen | .............. 365/185.03 |
| 2005/0047217 A1 | 3/2005 | Shibata et al. | |

FOREIGN PATENT DOCUMENTS

| | | |
|---|---|---|
| EP | 0788113 | 8/1999 |
| JP | 11185495 | 7/1999 |
| WO | 01/63614 | 8/2001 |

* cited by examiner

*Primary Examiner*—Vu A. Le
(74) *Attorney, Agent, or Firm*—Leffert Jay & Polglaze, P.A.

(57) ABSTRACT

A multiple level cell memory array has an area that can be programmed as single level cells. The cells to be programmed are initially programmed with the desire data into either the least significant or most significant bit of the cell. A second programming operation the programs reinforcing data that adjusts the threshold level of the cell to the appropriate level for the desired data.

33 Claims, 6 Drawing Sheets

SINGLE LEVEL CELL PROGRAMMING IN A MULTIPLE LEVEL CELL NON-VOLATILE MEMORY DEVICE

TECHNICAL FIELD OF THE INVENTION

The present invention relates generally to memory devices and in particular the present invention relates to non-volatile memory devices.

BACKGROUND OF THE INVENTION

Memory devices are typically provided as internal, semiconductor, integrated circuits in computers or other electronic devices. There are many different types of memory including random-access memory (RAM), read only memory (ROM), dynamic random access memory (DRAM), synchronous dynamic random access memory (SDRAM), and flash memory.

Flash memory devices have developed into a popular source of non-volatile memory for a wide range of electronic applications. Flash memory devices typically use a one-transistor memory cell that allows for high memory densities, high reliability, and low power consumption. Common uses for flash memory include personal computers, personal digital assistants (PDAs), digital cameras, and cellular telephones. Program code and system data such as a basic input/output system (BIOS) are typically stored in flash memory devices for use in personal computer systems.

As the performance and complexity of electronic systems increase, the requirement for additional memory in a system also increases. However, in order to continue to reduce the costs of the system, the parts count must be kept to a minimum. This can be accomplished by increasing the memory density of an integrated circuit.

Memory density can be increased by using multiple level cells (MLC). MLC memory can increase the amount of data stored in an integrated circuit without adding additional cells and/or increasing the size of the die. The MLC method stores two or more data bits in each memory cell.

MLC requires tight control of the threshold voltages in order to use multiple threshold levels per cell. One problem with non-volatile memory cells that are closely spaced, and MLC in particular, is the floating gate-to-floating gate capacitive coupling that causes interference between cells. The interference can shift the threshold voltage of neighboring cells as one cell is programmed. This is referred to as a program disturb condition that affects cells that are not desired to be programmed.

An MLC memory device also has a lower reliability than a single level cell (SLC) memory device due, in part, to the increased quantity of states requiring more closely spaced threshold voltages. A bad bit in a memory device used to store photographs can be tolerated more easily than a bad bit in a memory device that stores code. A bad bit in a photograph might only produce a bad pixel out of millions of pixels while a bad bit in code or other data could mean a corrupted instruction that affects the operation of an entire program.

Due to intense competition and consumer desire for longer battery life in electronic devices, manufacturers must constantly find ways to reduce the quantity of components in devices while maintaining reliability. For the reasons stated above, and for other reasons stated below that will become apparent to those skilled in the art upon reading and understanding the present specification, there is a need in the art for a memory device having high density with high reliability.

SUMMARY

The above-mentioned problems with flash memories and other problems are addressed by the present invention and will be understood by reading and studying the following specification.

The present invention encompasses a method for programming a multiple level, non-volatile memory device in a single level cell mode. The memory device has a plurality of memory cells that are organized into a plurality of memory blocks. Each memory block has a memory cell arrays comprised of bit line columns and word line rows.

The method includes writing the desired data to one of either the least significant bit or the most significant bit of a cell to be programmed. A second programming operation programs reinforcing data to the remaining bit of the cell. The reinforcing data adjusts the threshold level of the cell to the voltage required by the desired data.

Further embodiments of the invention include methods and apparatus of varying scope.

DETAILED DESCRIPTION

In the following detailed description of the invention, reference is made to the accompanying drawings that form a part hereof and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The following detailed description is, therefore, not to be taken in a limiting sense, and the scope of the present invention is defined only by the appended claims and equivalents thereof.

Figure 1:
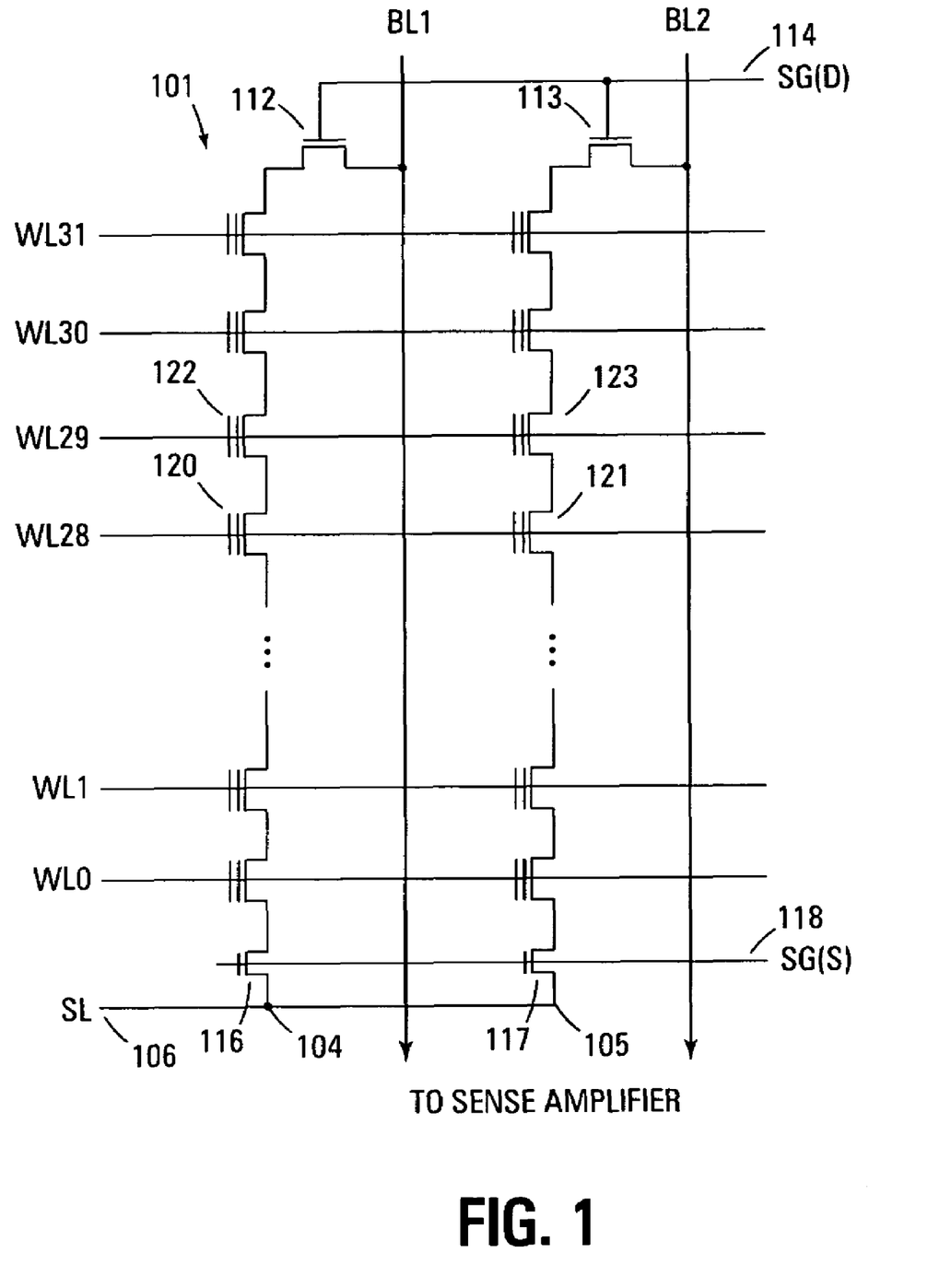
FIG. 1 shows a simplified diagram of one embodiment for a NAND flash memory array of the present invention.

FIG. 1 illustrates a simplified diagram of one embodiment for a semiconductor NAND flash memory array of the present invention. This memory array is for purposes of illustration only as the present invention is not limited any one non-volatile memory technology or architecture.

The memory array of FIG. 1, for purposes of clarity, does not show all of the elements typically required in a memory array. For example, only two bit lines are shown (BL1 and BL2) when the number of bit lines required actually depends upon the memory density and chip architecture. The bit lines are subsequently referred to as (BL1-BLN). The bit lines (BL1-BLN) are eventually coupled to sense amplifiers (not shown) that detect the state of each cell.

The array is comprised of an array of floating gate cells 101 arranged in series strings 104, 105. Each of the floating gate cells 101 are coupled drain to source in each series chain 104, 105. A word line (WL0-WL31) that spans across multiple series strings 104, 105 is coupled to the control gates of every floating gate cell in a row in order to control their operation. In one embodiment, an array is comprised of 32 word lines. However, the present invention is not limited to any one word line quantity.

In operation, the word lines (WL0-WL31) select the individual floating gate memory cells in the series chain 104, 105 to be written to or read from and operate the remaining floating gate memory cells in each series string 104, 105 in a pass through mode. Each series string 104, 105 of floating gate memory cells is coupled to a source line 106 by a source select gate 116, 117 and to an individual bit line (BL1-BLN) by a drain select gate 112, 113. The source select gates 116, 117 are controlled by a source select gate control line SG(S) 118 coupled to their control gates. The drain select gates 112, 113 are controlled by a drain select gate control line SG(D) 114.

In the embodiment of FIG. 1, WL0 is at the bottom of the page and WL31 is at the top of the page. However, these labels are for purposes of illustration only as WL0 can also begin at the top of the page with the word line numbers increasing towards the bottom of the page.

Each cell can be programmed as a single bit per cell (i.e., single level cell—SLC) or multiple bits per cell (i.e., multiple level cell—MLC). Each cell's threshold voltage ($V_t$) (determines the data that is stored in the cell. For example, in a single bit per cell, a $V_t$ of 0.5V might indicate a programmed cell (i.e., logical 0 state) while a $V_t$ of –0.5V might indicate an erased cell (i.e., logical 1 state).

A multilevel cell has multiple $V_t$ windows that each indicate a different state. Multilevel cells take advantage of the analog nature of a traditional flash cell by assigning a bit pattern to a specific voltage range stored on the cell. This technology permits the storage of two or more bits per cell, depending on the quantity of voltage ranges assigned to the cell.

For example, a cell may be assigned four different voltage ranges of 200 mV for each range. Typically, a dead space or margin of 0.2V to 0.4V is between each range. If the voltage stored on the cell is within the first range, the cell is storing a 11. If the voltage is within the second range, the cell is storing a 01. This continues for as many ranges that are used for the cell. In one embodiment, 11 is the most negative threshold voltage range while 10 is the most positive threshold voltage range. Alternate embodiments assign the logical states to different threshold voltage ranges.

The embodiments of the present invention are not limited to two bits per cell. Some embodiments may store more than two bits per cell, depending on the quantity of different voltage ranges that can be differentiated on the cell. 100311 During a typical prior art programming operation, the selected word line for the flash memory cell to be programmed is biased with a series of programming pulses that start at a voltage that, in one embodiment, is greater than 16V with each subsequent pulse voltage increasing incrementally until the cell is programmed or a maximum programming voltage is reached.

A verification operation with a word line voltage of 0V is then performed to determine if the floating gate is at the proper voltage (e.g., 0.5V). The unselected word lines for the remaining cells are typically biased at approximately 10V during the program operation. In one embodiment, the unselected word line voltages can be any voltage equal to or greater than ground potential. Each of the memory cells is programmed in a substantially similar fashion.

A typical memory block may be comprised of 64 pages of single level cells. An MLC memory block is typically comprised of 128 pages. When one of these pages is accessed in a typical prior art read/program operation, the remaining pages in the block can experience a disturb condition. In both cases, the pages share common word lines and bitlines that can experience higher programming/read voltages whenever any one of the pages is programmed/read. These voltages can cause problems by disturbing the distributions for the cells that are not being accessed. The embodiments of the present invention, as discussed subsequently, use a scrambled logical addressing technique that substantially reduces or eliminates the disturb condition.

Figure 2:
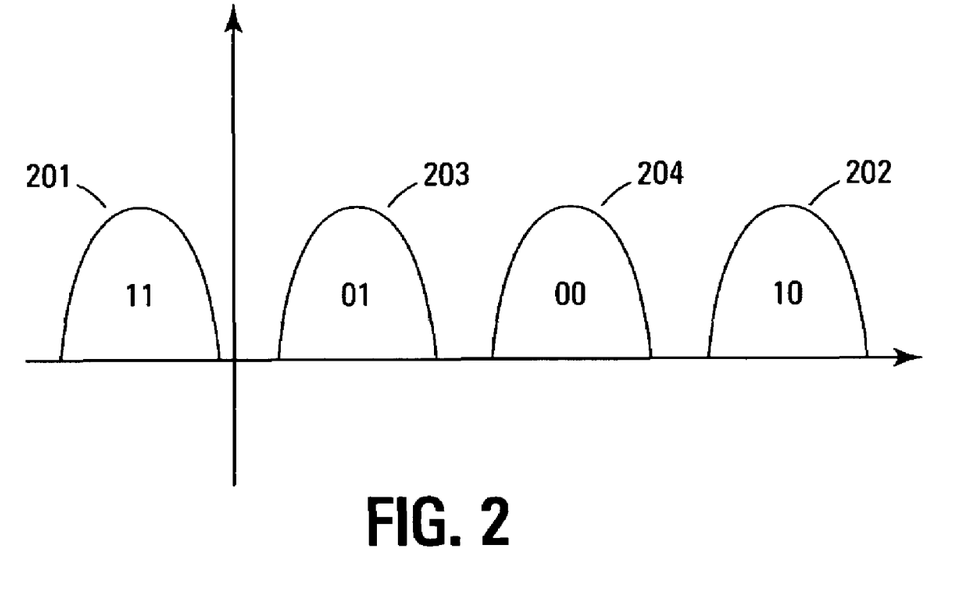
FIG. 2 shows a diagram of one embodiment of a threshold voltage distribution for a multiple level cell memory array.

FIG. 2 illustrates a diagram of one embodiment of an MLC threshold voltage distribution in accordance with the programming method of the present invention. This diagram shows that the logical 11 state 201 is the most negative state and the logical 10 state 202 is the most positive state. The 01 state 203 and the 00 state 204 are located between the most distant states 201, 202.

Figure 3:
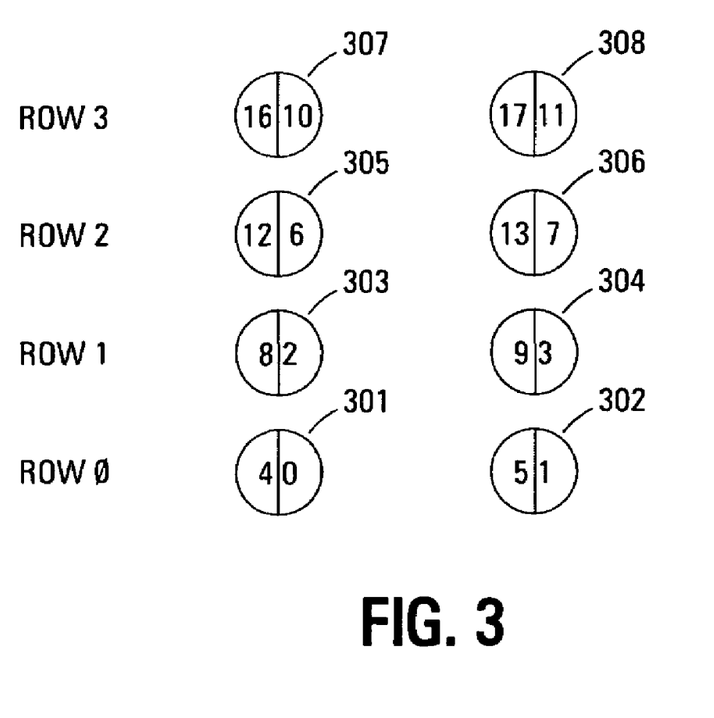
FIG. 3 shows a diagram of one embodiment of a simplified memory array in accordance with the programming method of the present invention.

FIG. 3 illustrates a write pattern to a simplified memory array using the single level programming embodiments of the present invention. For purposes of clarity, only four physical rows with two physical bits in each row are shown. The portion of the MLC memory array chosen to be programmed as SLC memory may be one or more memory blocks.

The numbers shown in each cell 301-308 represent the logical page numbers that are written to each particular cell 301-308. This particular pattern was chosen to minimize the floating gate-to-floating gate coupling that occurs when cells are programmed. The present invention, however, is not limited to any one programming pattern.

Each physical cell 301-308 is capable of holding two logical bits, as described previously regarding programming of MLC. Therefore, the addressing scheme of the present invention assigns two scrambled, logical addresses to each physical address. In other words, to increase the noise margin, no physical cell 301-308 in the SLC area of the array has two adjacent logical addresses.

In the illustrated embodiment, logical pages 0 and 1 are programmed into cells 301, 302. Logical pages 2 and 3 are programmed into cells 303, 304 of row 1. Logical pages 4 and 5 are then programmed into cells 301, 302 of row 0. Logical pages 8 and 9 are programmed into cells 303, 304 of row 1. This pattern is repeated throughout the 128 pages of a memory block that is programmed in an SLC manner.

In order to program a physical cell in an MLC manner, each bit of data/code to be programmed is represented by two logical bits. In one embodiment, a logical 11 is assigned to represent a single level bit of 1 while a logical 10 is assigned to represent a single level bit of 0. This data pattern was chosen since the present embodiment of MLC memory, the threshold voltage of 11 is the most negative and the threshold voltage of 10 is the most positive thus substantially reducing the floating gate-to-floating gate interference and increasing the noise margin. Alternate embodiments may use other states besides logical 11 and/or 10.

Figure 4:
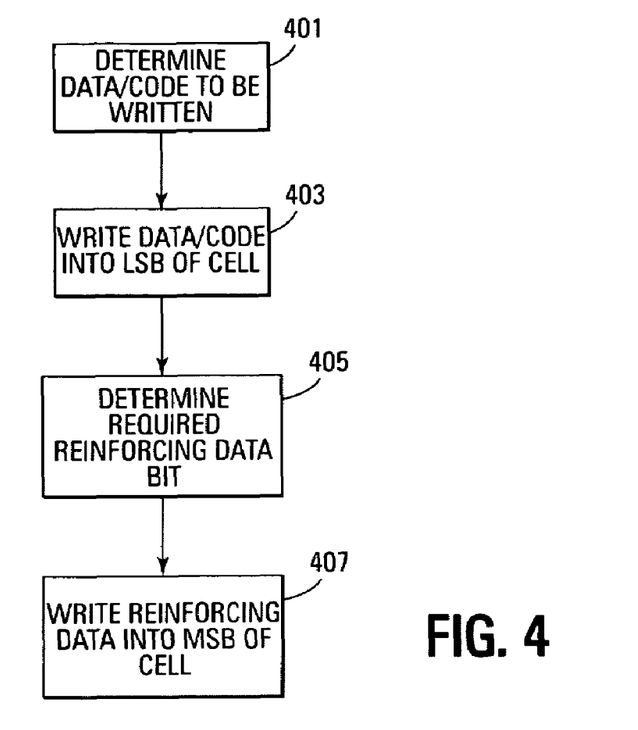
FIG. 4 shows a flow chart of one embodiment of a method of the present invention for single level cell programming of a multiple level cell memory device.

FIG. 4 illustrates a flow chart of one embodiment of a method of the present invention for single level cell programming of a multiple level cell memory device. For purposes of clarity, only the programming of one cell (e.g., cell 301 of FIG. 3) will be described. The programming of the remainder of the SLC memory block is accomplished in a substantially similar manner. The following discussion refers to both FIGS. 3 and 4.

The data to be stored 401 is received. In one embodiment, as described subsequently with reference to FIG. 5, the received data includes an indication that it is code that requires the more reliable SLC programming of the present invention as opposed to the MLC programming performed for data not requiring the higher reliability.

In one embodiment, the LSB of the cell to be programmed is programmed first 403. However, an alternate embodiment may program the MSB first and the LSB last.

In the illustrated embodiment, the method first programs page 0 into the cell 301 (i.e., LSB). If the cell started from the erased state (i.e., a logical 11) and the data/code bit is a logical 0, then the cell 301 now has a programmed pattern of a logical 10.

When page 4 is to be programmed into the cell 301, it must be done so as to reinforce the desired data/code bit of 0. The reinforcing data is that data which changes the threshold voltage of each SLC programmed cell to the appropriate threshold voltage required for the desire single level data. Therefore, the reinforcing data must be determined 405 and then written into the cell 407. In the present example, a logical 10 is assigned to represent an SLC data bit of logical 0, so the cell is already at the proper threshold voltage. Therefore, when the cell is read, the threshold voltage to which logical 10 state is assigned will be detected and a logical 0 is read.

The above-described example, for purposes of clarity, does not discuss the programming of pages 1-3. By referring to FIGS. 2-4, it can be seen that the other pages are programmed in substantially the same manner.

As another example, if a data/code bit of logical 0 is desired to be programmed into the cell 301 and the cell 301 has already been programmed from a previous page write operation with a logical 01, page 0 of the cell needs to program a logical 0 into the LSB of the cell 301. This is accomplished by raising the threshold voltage of the cell 301 from the logical 01 state to the level of the logical 10 state as seen in FIG. 2. This assumes that the logical 10 state of MLC is equivalent to the logical 0 state of SLC.

Figure 5:
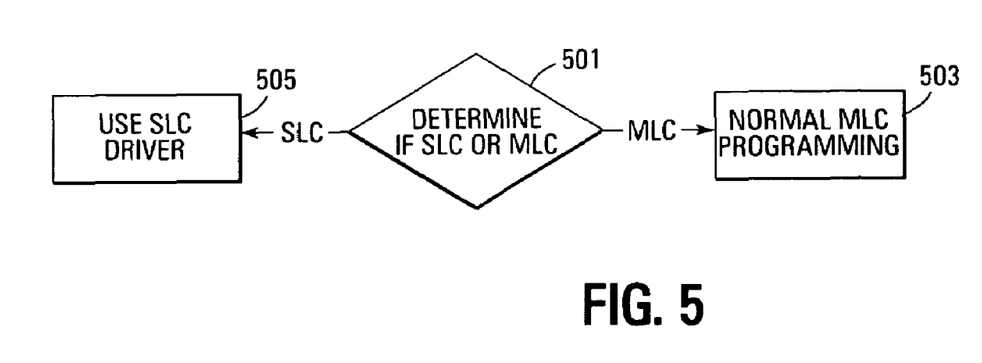
FIG. 5 shows a flow chart of one embodiment of a method for implementation of the single level cell programming method of the present invention in a memory system.

FIG. 5 illustrates a flow chart of one embodiment of a method for implementation of the single level cell programming method of the present invention in a multiple level cell memory system. The method determines 501 if the data to be written is code that requires a higher reliability storage or other data that can tolerate the lower reliability of MLC programming.

This determination can be accomplished in various ways. In one embodiment, the physical address indicates whether the user is writing to an SLC area of memory or an MLC area. For example, an address that is in the first 32 MB of the memory array address space can be set aside for SLC data while the remainder of the array address space is MLC data. In such an embodiment, when the data is read, it is assumed that the multiple bits that are read map to a single level data bit.

In another embodiment, an indicator bit is included with the data to dynamically indicate whether to use the SLC driver or the normal MLC programming method. Alternate embodiments can use other forms to identify the type of programming.

The SLC driver 505 has been described with reference to FIGS. 3 and 4. This routine can be executed by the memory integrated circuit control circuitry such as a state machine, processor, or other controller. The normal MLC programming 503 has been described previously with reference to FIG. 1.

Figure 6:
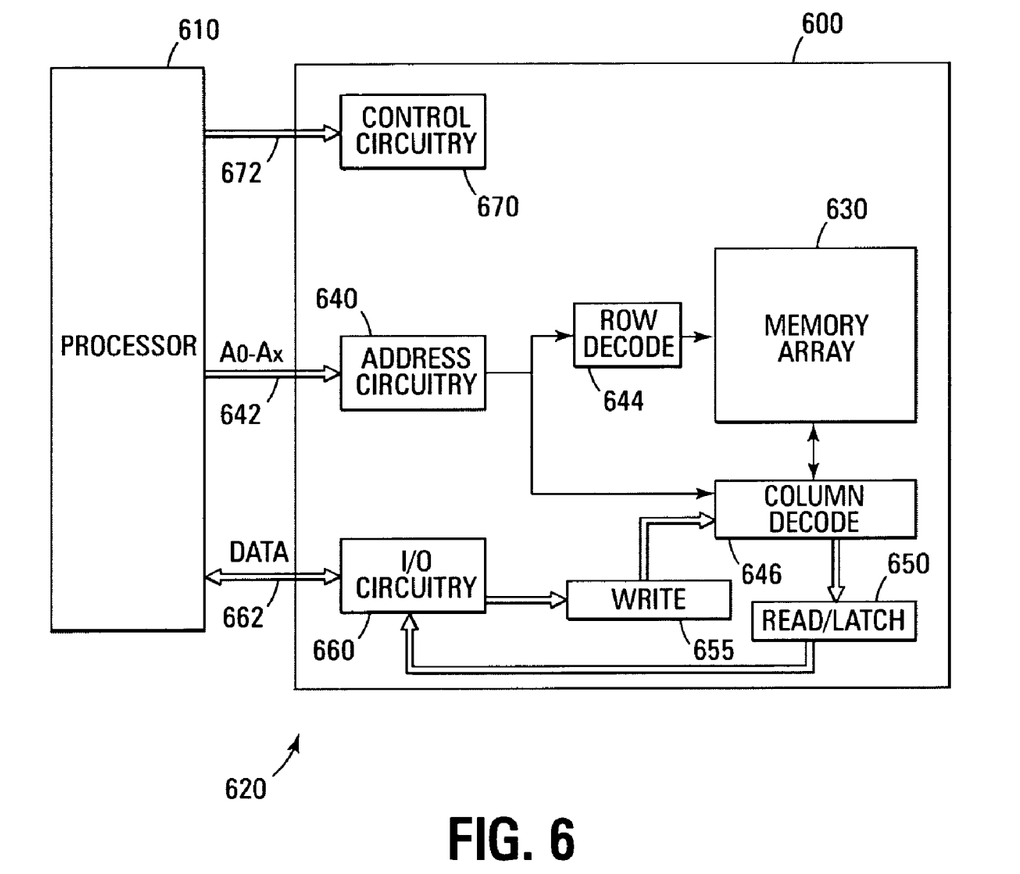
FIG. 6 shows a block diagram of one embodiment of the memory system of the present invention.

FIG. 6 illustrates a functional block diagram of a memory device 600 that can incorporate the flash memory array and programming method embodiments of the present invention. The memory device 600 is coupled to a processor 610 that is responsible for executing the software driver of the present invention for writing SLC data into an MLC device. The processor 610 may be a microprocessor or some other type of controlling circuitry. The memory device 600 and the processor 610 form part of a memory system 620. The memory device 600 has been simplified to focus on features of the memory that are helpful in understanding the present invention;

The processor 610 is coupled to the system memory 680. This memory block 680 includes all of the memory required by the system such as RAM, ROM, magnetic storage drives, or other forms of memory. A memory system may have any one of these types of system memory or all of them. In one embodiment, the low-level software driver of the present invention that enables SLC storage in MLC memory is stored in this system memory 680. The driver may be part of the system 620 operating system that is stored on a hard drive or ROM and eventually read into RAM for execution. The software modules illustrated in FIG. 8 and discussed subsequently show one possible configuration for the software driver of the present invention.

The memory device includes an array of flash memory cells 630 as described above with reference to FIG. 6. The memory array 630 is arranged in banks of rows and columns. The control gates of each row of memory cells is coupled with a word line while the drain and source connections of the memory cells are coupled to bitlines. As is well known in the art, the connections of the cells to the bitlines determines whether the array is a NAND architecture, an AND architecture, or a NOR architecture.

An address buffer circuit 640 is provided to latch address signals provided on address input connections A0-Ax 642. Address signals are received and decoded by a row decoder 644 and a column decoder 646 to access the memory array 630. It will be appreciated by those skilled in the art, with the benefit of the present description, that the number of address input connections depends on the density and architecture of the memory array 630. That is, the number of addresses increases with both increased memory cell counts and increased bank and block counts.

The memory device 600 reads data in the memory array 630 by sensing voltage or current changes in the memory array columns using sense/buffer circuitry 650. The sense/buffer circuitry, in one embodiment, is coupled to read and latch a row of data from the memory array 630. Data input and output buffer circuitry 660 is included for bi-directional data communication over a plurality of data connections 662 with the controller 610. Write circuitry 655 is provided to write data to the memory array.

Control circuitry 670 decodes signals provided on control connections 672 from the processor 610. These signals are used to control the operations on the memory array 630, including data read, data write (program), and erase operations. The control circuitry 670 may be a state machine, a sequencer, or some other type of controller.

The flash memory device illustrated in FIG. 6 has been simplified to facilitate a basic understanding of the features of the memory. A more detailed understanding of internal circuitry and functions of flash memories are known to those skilled in the art.

Figure 7:
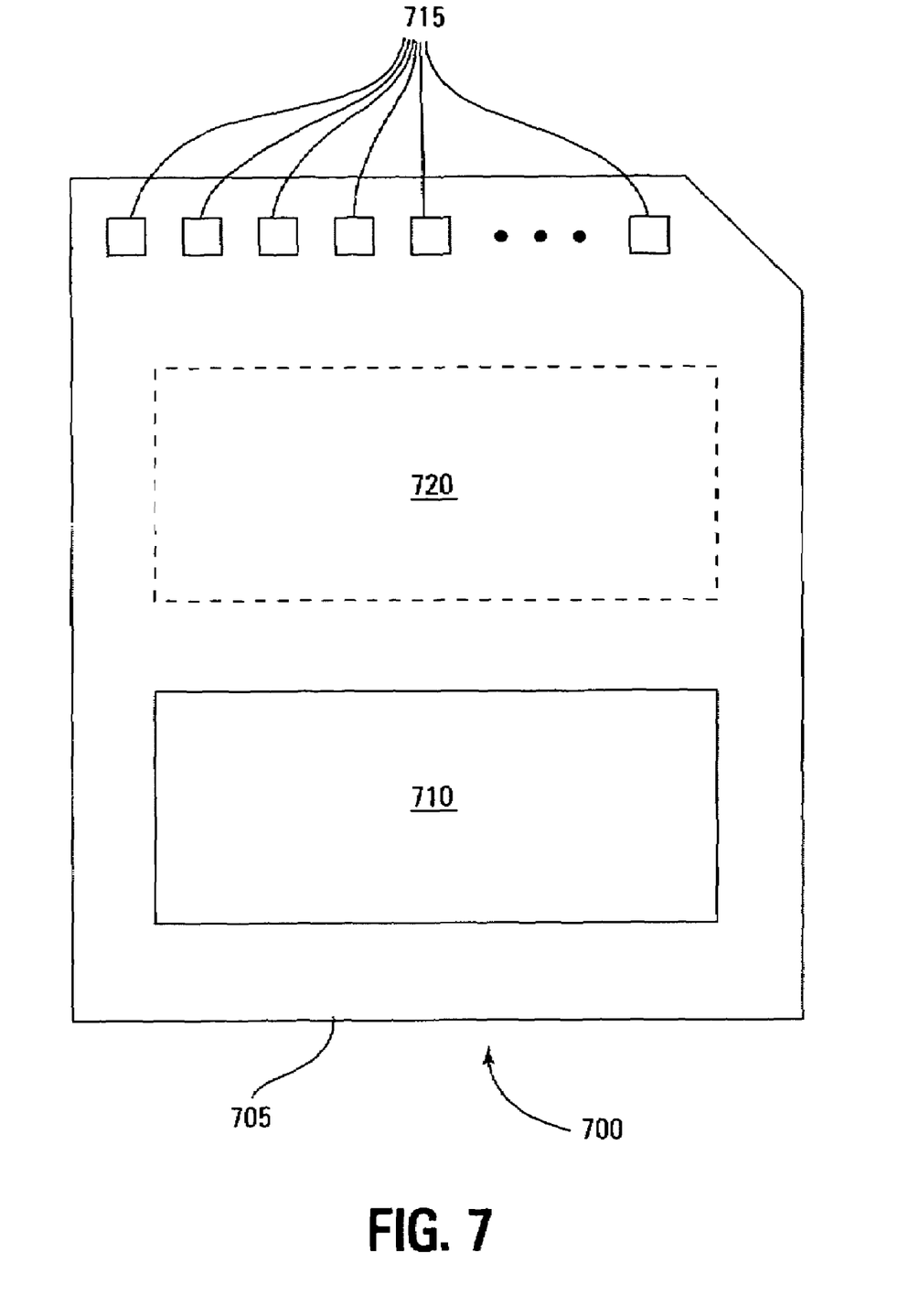
FIG. 7 shows a block diagram of one embodiment of a memory module of the present invention.

FIG. 7 is an illustration of an exemplary memory module 700. Memory module 700 is illustrated as a memory card, although the concepts discussed with reference to memory module 700 are applicable to other types of removable or portable memory, e.g., USB flash drives, and are intended to be within the scope of "memory module" as used herein. In addition, although one example form factor is depicted in FIG. 7, these concepts are applicable to other form factors as well.

In some embodiments, memory module 700 will include a housing 705 (as depicted) to enclose one or more memory devices 710, though such a housing is not essential to all devices or device applications. At least one memory device 710 is a non-volatile memory [including or adapted to perform elements of the invention]. Where present, the housing 705 includes one or more contacts 715 for communication with a host device. Examples of host devices include digital cameras, digital recording and playback devices, PDAs, personal computers, memory card readers, interface hubs and the like. For some embodiments, the contacts 715 are in the form of a standardized interface. For example, with a USB flash drive, the contacts 715 might be in the form of a USB Type-A male connector. For some embodiments, the contacts 715 are in the form of a semi-proprietary interface, such as might be found on COMPACTFLASH memory cards licensed by SANDISK Corporation, MEMORYSTICK memory cards licensed by SONY Corporation, SD SECURE DIGITAL memory cards licensed by TOSHIBA Corporation and the like. In general, however, contacts 715 provide an interface for passing control, address and/or data signals between the memory module 700 and a host having compatible receptors for the contacts 715.

The memory module 700 may optionally include additional circuitry 720 which may be one or more integrated circuits and/or discrete components. For some embodiments, the additional circuitry 720 may include a memory controller for controlling access across multiple memory devices 710 and/or for providing a translation layer between an external host and a memory device 710. For example, there may not be a one-to-one correspondence between the number of contacts 715 and a number of I/O connections to the one or more memory devices 710. Thus, a memory controller could selectively couple an I/O connection (not shown in FIG. 7) of a memory device 710 to receive the appropriate signal at the appropriate I/O connection at the appropriate time or to provide the appropriate signal at the appropriate contact 715 at the appropriate time. Similarly, the communication protocol between a host and the memory module 700 may be different than what is required for access of a memory device 710. A memory controller could then translate the command sequences received from a host into the appropriate command sequences to achieve the desired access to the memory device 710. Such translation may further include changes in signal voltage levels in addition to command sequences.

The additional circuitry 720 may further include functionality unrelated to control of a memory device 710 such as logic functions as might be performed by an ASIC (application specific integrated circuit). Also, the additional circuitry 720 may include circuitry to restrict read or write access to the memory module 700, such as password protection, biometrics or the like. The additional circuitry 720 may include circuitry to indicate a status of the memory module 700. For example, the additional circuitry 720 may include functionality to determine whether power is being supplied to the memory module 700 and whether the memory module 700 is currently being accessed, and to display an indication of its status, such as a solid light while powered and a flashing light while being accessed. The additional circuitry 720 may further include passive devices, such as decoupling capacitors to help regulate power requirements within the memory module 700.

Figure 8:
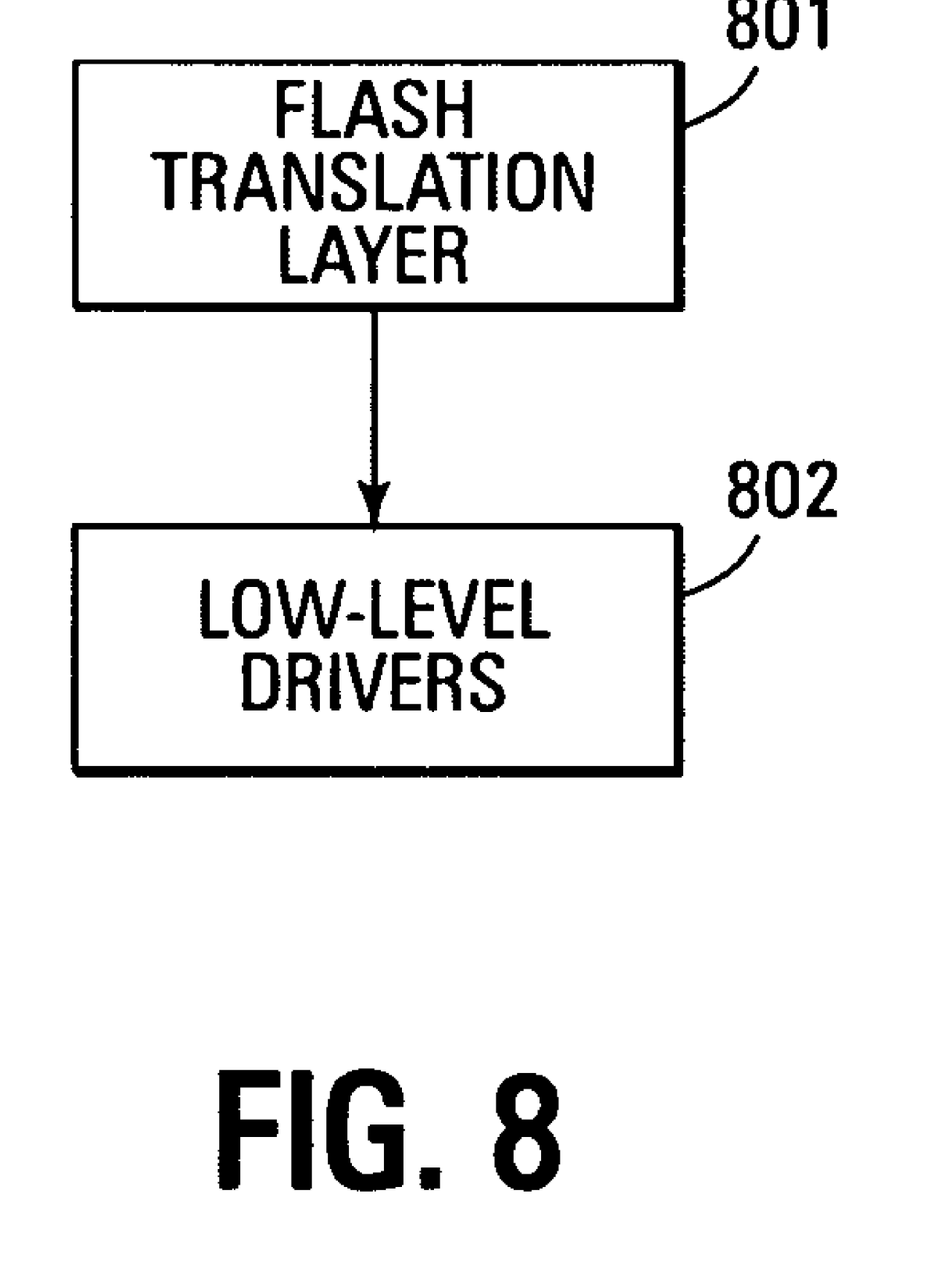
FIG. 8 shows a block diagram of one embodiment of software modules of the present invention for programming/reading a non-volatile memory integrated circuit.

FIG. 8 illustrates a block diagram of software modules of the present invention for programming memory devices. The modules are comprised of a flash translation layer (FTL) 801 and at least one low-level software driver 802. While only one low-level driver 802 is shown in FIG. 8, it is well known in the art that a memory system may have multiple such drivers.

The high-level driver 801 works in conjunction with an operating system or an application to manage a flash memory integrated circuit. The FTL 801 manages data in a flash device so that it appears that the data is written to a particular location when in fact the data is being stored in different locations of the flash. The FTL 801 moves the data to different physical locations in the flash memory array in order to achieve more even wear characteristics. This allows the flash device to appear as a disk drive or other block storage device to the processor.

The low-level drivers 802 are responsible for taking the remapped addresses and data from the FTL 801 and performing the actual programming/reading of the data. In one embodiment, the embodiments of the SLC programming in an MLC flash memory device are performed by a low-level memory driver.

CONCLUSION

In summary, the embodiments of the present invention create an MLC non-volatile memory device with at least one SLC memory cell in the same memory array as a plurality of MLC data. The programming/reading of SLC data in the MLC device is determined dynamically by control circuit/processor executing a low-level software driver in response to data reliability or address. This gives the end user of the MLC non-volatile memory device the option of storing sensitive code data in the SLC area for higher reliability and other, less sensitive data in the denser MLC area of the array.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. A method for single level programming in a multiple level cell memory device, the method comprising:
   writing desired data to one of either a least significant bit or a most significant bit of the cell; and
   writing reinforcing data to the remaining bit of the cell such that a threshold voltage of the cell is adjusted to a voltage level required by the desired data.

2. The method of claim 1 and further including determining a type of data to be written.

3. The method of claim 2 wherein the type of data includes data requiring high reliability and data requiring high memory density.

4. The method of claim 1 wherein writing the reinforcing data changes the threshold voltage for the cell to a voltage level required for the desired data.

5. The method of claim 4 wherein the desired data has a threshold voltage in a multiple level cell range of threshold voltages such that a logical one state is at the most negative of the range and a logical zero state is at the most positive of the range.

6. The method of claim 1 wherein the memory device is a NAND flash memory device.

7. The method of claim 1 and further including reading the desired data by mapping the read multiple level cell data to a single level cell data.

8. The method of claim 7 wherein a '11' state maps to a logical one state and a '10' state maps to a logical zero state.

9. A method for single level programming in a multiple level cell NAND flash memory device, the method comprising:
   determining a type of data to be programmed;
   writing desired data to a least significant bit of a cell; and
   writing reinforcing data that changes a threshold voltage of the cell to a voltage level required by the desired data.

10. The method of claim 9 wherein writing to the least significant bit comprises writing to page 0 of the memory device.

11. The method of claim 10 wherein writing the reinforcing data comprises writing page that is not adjacent to page 0 of the memory device.

12. A method for single level programming in a multiple level cell memory device comprising memory with a least significant page and a most significant page, the method comprising:
   writing desired data to either the least significant page or the most significant page of at least one memory cell; and
   writing reinforcing data to the remaining page of the at least one memory cell such that the remaining page is a non-adjacent page to the previously written page of each cell and is composed of reinforcing data to the desired data.

13. The method of claim 12 wherein the most significant page is at least four pages from the least significant page.

14. The method of claim 13 wherein the most significant page is four pages from the least significant page in row zero of the single level array area and six pages from the least significant page in the remaining rows of the area.

15. A memory device comprising:
   a plurality of multiple level cells formed into an array of cells; and
   at least one single level cell within the array of cells that is programmed and read as a single level cell in response to a memory driver that is adapted to write desired data to one of either a least significant bit or a most significant bit of the at least one single level cell and write reinforcing data to the remaining bit of the cell such that a threshold voltage of the cell is adjusted to a voltage level required by the desired data.

16. The device of claim 15 wherein the at least one single level cell is a plurality of cells that are dynamically chosen by the driver to store data requiring higher reliability than data stored in the multiple level cells.

17. The device of claim 15 wherein the array is a NAND flash memory array.

18. The device of claim 15 wherein programmed single level cells are comprised of threshold voltage levels that are mapped to either a logical one state or a logical zero state.

19. A flash memory device comprising:
   a memory array comprising a plurality of cells that are programmable to multiple levels within a range of threshold voltages; and
   control circuitry that is adapted to execute a single level programming method comprising writing desired data to one of either the least significant bit or the most significant bit of a dynamically selected cell, and writing reinforcing data to the remaining bit of the cell.

20. The device of claim 19 wherein the reinforcing data adjusts a threshold voltage level for a cell being programmed to a level consistent with the desired data.

21. The device of claim 20 wherein the desired data comprises one of a negative threshold voltage for a logical one state and a positive threshold voltage for a logical zero state.

22. The device of claim 21 wherein the logical one state is a furthest state from the logical zero state in the range of threshold voltages.

23. A memory system comprising:
   a processor that generates memory signals and executes a memory driver; and
   a memory device coupled to the processor and operating in response to the memory signals, the memory device comprising:
     a plurality of multiple level cells formed as an array of cells; and
     a control circuit that programs at least one multiple level cell in a single level format in response to the memory driver wherein the memory driver is adapted to write desired data to one of either a least significant bit or a most significant bit of the at least one multiple level cell and write reinforcing data to the remaining bit of the cell such that a threshold voltage of the cell is adjusted to a voltage level required by the desired data.

24. A memory module comprising:
   a multiple level memory array arranged in rows and columns such that the rows comprise word lines coupled to control gates of a plurality of memory cells and the columns comprise bit lines coupled to series strings of memory cells, the memory array further arranged in memory blocks; and
   control circuitry that is adapted to perform single level programming of at least one dynamically selected cell of the memory array by writing desired data to one of either a least significant bit or a most significant bit of the cell and writing reinforcing data to the remaining bit of the cell; and
   a plurality of contacts configured to provide selective contact between the memory array and a host system.

25. The module of claim 24 and further including a memory controller coupled to the memory array for controlling operation of the memory device in response to the host system.

26. A method for single level programming in a multiple level cell NAND flash memory device comprising a memory array, the method comprising:
   determining a type of data to be programmed;
   writing either multiple level cell data or single level cell data to at least one selected cell of the array in response to the type of data;

if the type of data is indicative of high reliability, writing desired data to a first bit of a cell and writing reinforcing data to a remaining bit of the cell that changes a threshold voltage of the cell to a voltage level required by the desired data; and if the type of data is indicative of high memory density, writing the desired data in multiple level cell manner.

27. The method of claim 26 wherein writing the desired data in a multiple level cell manner comprises programming the cell to a desired threshold voltage level with a single programming operation.

28. A memory system comprising:
a processor that generates memory signals and executes a high level memory driver and a low-level memory driver; and
a memory device coupled to the processor and operating in response to the memory signals, the memory device comprising:
a plurality of multiple level cells formed as an array of cells; and
a control circuit that programs a plurality of multiple level cells in a single level cell format in response to the high-level memory driver and the low-level memory driver wherein the low-level memory driver is adapted to write desired data to one of either a least significant bit or a most significant bit of each of the plurality of multiple level cells and write reinforcing data to the remaining bit of each of the plurality of multiple level cells such that a threshold voltage of each cell is adjusted to a voltage level required by the desired data.

29. The device of claim 28 wherein the reinforcing data increases a threshold voltage level for a cell being programmed to a level consistent with the desired data.

30. The device of claim 29 wherein the desired data a positive threshold voltage for a logical zero state.

31. The device of claim 28 wherein a logical one state is a furthest state from the logical zero state in the range of threshold voltages.

32. A flash memory system having a processor coupled to system memory and to a flash memory device, the system comprising:
a high-level driver that is executed by the processor and selects memory locations of the flash memory device to which data is written; and
a low-level driver, coupled to the high-level driver, that is executed by the processor to write single level cell data into multiple level cell memory locations as determined by the high-level driver in response to a type of data being written wherein the low-level driver is adapted to write the single level cell data to one of either a least significant bit or a most significant bit of each of the multiple level cell memory locations and write reinforcing data to the remaining bit of each of the multiple level cell memory locations such that a threshold voltage of each location is adjusted to a voltage level required by the desired data.

33. The system of claim 32 wherein the type of data comprises either high reliability data or less sensitive data.

* * * * *

UNITED STATES PATENT AND TRADEMARK OFFICE
CERTIFICATE OF CORRECTION

| | |
|---|---|
| PATENT NO. | : 7,366,013 B2 |
| APPLICATION NO. | : 11/298013 |
| DATED | : April 29, 2008 |
| INVENTOR(S) | : Roohparvar |

It is certified that error appears in the above-identified patent and that said Letters Patent is hereby corrected as shown below:

On the Title page, in field (56), under "Foreign Patent Documents", in column 2, line 2, delete "11185495" and insert -- 11185491 --, therefor.

Signed and Sealed this

Twenty-ninth Day of July, 2008

JON W. DUDAS
*Director of the United States Patent and Trademark Office*